(12) United States Patent
Chandran et al.

(10) Patent No.: US 7,122,403 B2
(45) Date of Patent: Oct. 17, 2006

(54) METHOD OF INTERCONNECTING DIE AND SUBSTRATE

(75) Inventors: Biju Chandran, Chandler, AZ (US); Carlos A. Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/010,123

(22) Filed: Dec. 10, 2004

(65) Prior Publication Data

US 2005/0116329 A1 Jun. 2, 2005

Related U.S. Application Data

(62) Division of application No. 10/023,723, filed on Dec. 21, 2001, now abandoned.

(51) Int. Cl.
*H01L 21/44* (2006.01)
*H01L 29/40* (2006.01)

(52) U.S. Cl. .................. 438/108; 438/106; 257/778; 257/779

(58) Field of Classification Search .......... 438/106, 438/108; 257/778, 779
See application file for complete search history.

(56) References Cited

U.S. PATENT DOCUMENTS

| | | | |
|---|---|---|---|
| 3,871,015 A | 3/1975 | Lin et al. | |
| 4,481,403 A | 11/1984 | Del Monte | |
| 5,308,980 A | 5/1994 | Barton | |
| 5,369,551 A | 11/1994 | Gore et al. | |
| 5,542,601 A * | 8/1996 | Fallon et al. | 228/119 |
| 5,698,465 A | 12/1997 | Lynch et al. | |
| 5,773,889 A | 6/1998 | Love et al. | |
| 5,790,377 A | 8/1998 | Schreiber et al. | |
| 5,872,401 A | 2/1999 | Huff et al. | |
| 5,889,652 A | 3/1999 | Turturro | |
| 5,931,371 A | 8/1999 | Pao et al. | |
| 5,936,304 A | 8/1999 | Lii et al. | |
| 6,002,590 A | 12/1999 | Farnworth et al. | |

(Continued)

FOREIGN PATENT DOCUMENTS

JP 59-177957 10/1984

(Continued)

OTHER PUBLICATIONS

ANONYMOUS, "Solder ball for semiconductor chip—has height increased so that stress caused by difference in thermal expansion between chip and substrate is minimised" *Research Disclosure RD-291011*, Derwent 1988-255069,(Jul. 10, 1988),2 pages.

(Continued)

*Primary Examiner*—Carl Whitehead, Jr.
*Assistant Examiner*—James Mitchell
(74) *Attorney, Agent, or Firm*—Schwegman, Lundberg, Woessner & Kluth, P.A.

(57) ABSTRACT

A low resistance package-to-die interconnect scheme for reduced die stresses includes a relatively low melting temperature and yield strength solder on the die and a relatively higher melting temperature and electrically conductive material such as copper on the substrate. A soldered joint connects the solder to the electrically conductive material to couple/connect the die and substrate to one another. The soldered joint is formed by heating the die and solder thereon to at least the melting temperature of the solder and thereafter contacting the molten solder with the conductive material on the substrate, which is at a substantially lower temperature for minimizing residual stress from soldering due to coefficient of thermal expansion mismatch between the substrate and die.

17 Claims, 3 Drawing Sheets

U.S. PATENT DOCUMENTS

| | | | |
|---|---|---|---|
| 6,014,317 A | 1/2000 | Sylvester | |
| 6,049,124 A | 4/2000 | Raiser et al. | |
| 6,162,660 A * | 12/2000 | LaFontaine et al. | 438/108 |
| 6,170,155 B1 | 1/2001 | Marion et al. | |
| 6,191,952 B1 | 2/2001 | Jimarez et al. | |
| 6,222,277 B1 | 4/2001 | Downes | |
| 6,259,155 B1 | 7/2001 | Interrante et al. | |
| 6,310,403 B1 | 10/2001 | Zhang et al. | |
| 6,320,754 B1 | 11/2001 | Dauksher et al. | |
| 6,330,967 B1 | 12/2001 | Milewski et al. | |
| 6,365,435 B1 * | 4/2002 | Wang et al. | 438/108 |
| 6,395,124 B1 | 5/2002 | Oxman et al. | |
| 6,402,012 B1 | 6/2002 | Bolduc | |
| 6,472,762 B1 | 10/2002 | Kutlu | |
| 6,555,052 B1 | 4/2003 | Soga et al. | |
| 6,581,821 B1 | 6/2003 | Sarkhel | |
| 6,664,637 B1 | 12/2003 | Jimarez et al. | |
| 6,689,635 B1 * | 2/2004 | Cobbley et al. | 438/106 |
| 6,798,072 B1 * | 9/2004 | Kajiwara et al. | 257/778 |
| 6,847,118 B1 * | 1/2005 | Milewski et al. | 257/738 |
| 2001/0008309 A1 | 7/2001 | Iijima et al. | |
| 2002/0140094 A1 * | 10/2002 | Kubota et al. | 257/737 |
| 2002/0155637 A1 * | 10/2002 | Lee | 438/108 |
| 2002/0195707 A1 | 12/2002 | Bernier et al. | |
| 2003/0003624 A1 * | 1/2003 | Farooq et al. | 438/108 |
| 2004/0227256 A1 * | 11/2004 | Seko | 257/784 |

FOREIGN PATENT DOCUMENTS

| | | |
|---|---|---|
| JP | 08-332590 | 12/1996 |
| JP | 09-275107 | 10/1997 |
| JP | 10-12659 | 1/1998 |

OTHER PUBLICATIONS

Hong, B. Z., "Thermal Fatigue Analysis of CBGA Package with Lead-Free Solder-Fillets", *Proceedings of the 1998 Intersociety Conference on Thermal Phenomena*, (Aug., 1998),205-211.

Karim, Z. S., et al., "Lead-Free Bump Interconnections for Flip-Chip Applications", *Proceedings of the 2000 IEEE/CPMT International Electronics Manufacturing Technology Symposium*, (Jan., 2000),274-278.

Wang, T., et al., "Studies on A Novel Flip-Chip Interconnect Structure-Pillar Bump", *Proceedings of the 2001 Electronic Components and Technology Conference*, (Apr., 2001),5 p.

Xia, G., et al., "The Effect of Cu Stud Structure and Eutectic Solder Electroplating on Intermetallic Growth and Reliability of Flip-Chip Solder Bump", *Proceedings of the 2000 Electronic Components and Technology Conference*, (Sep., 2000),54-59.

* cited by examiner

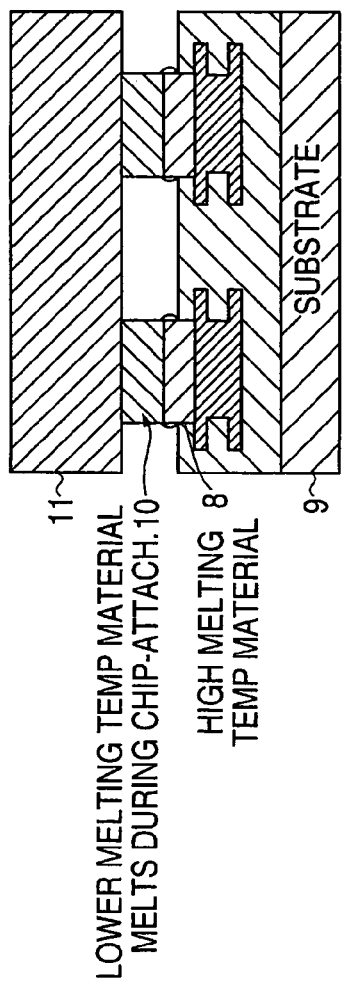
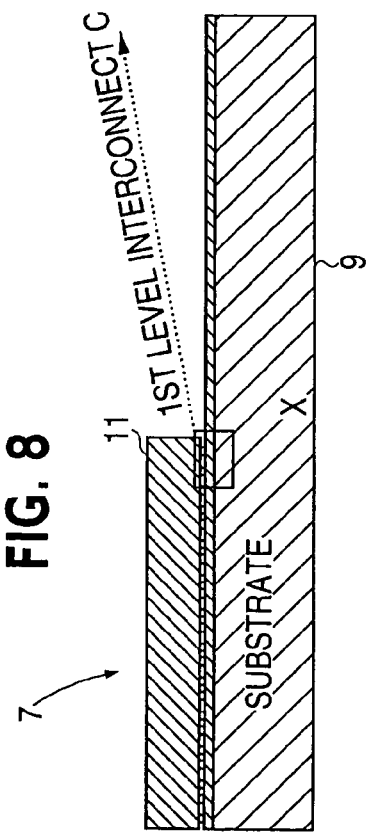
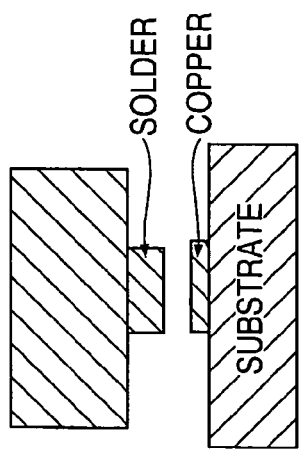

even cracked substrate. This invention calls for the
METHOD OF INTERCONNECTING DIE AND SUBSTRATE This application is a divisional of U.S. patent application Ser. No. 10/023,723, filed on Dec. 21, 2001 now abandoned, which is incorporated herein by reference.

FIELD

The invention relates to an improved low resistance package-to-die interconnect scheme for reduced die stresses, and particularly to an electronic assembly/semiconductor package employing the same. A method of interconnecting a die and substrate according to the invention is also disclosed.

BACKGROUND

A conventional die to package interconnect architecture is illustrated in FIGS. 1–3 of the drawings. In the prior art semiconductor package 1, the interconnect scheme between die 2 and substrate 3 comprises copper bumps 4 which are electroplated on the die, and eutectic AgSn solder 5 which is paste printed on the substrate lands. Soldered joints are formed in the conventional process by placing the die with copper bumps and the substrate with contact lands or pads to which solder has been applied in contact with one another and heating the die and substrate together to a temperature higher than the solder melting temperature, followed by cooling the soldered assembly. The solder on the contact pads of the substrate is reflowed during this joining process to wet the copper standoffs on the die to form the soldered joints.

The die in the conventional package comprises thin film, inter layer dielectric (ILD) layers 6, see FIG. 4, on its front, lower surface under the copper bumps of the interconnect architecture. Due to the inherent weakness (cohesive and adhesive strengths) of the ILD material, stresses on the dielectric layers during reliability testing of the package can cause gross delamination of the ILD interfaces. A current focus for addressing the reliability issue posed by such ILD delamination in the die is on increasing the ILD material cohesive and adhesive strengths by modifying its chemistry, and by interface toughening schemes.

The ILD material that is typically used is carbon doped oxide. However, other ILD materials being evaluated for possible use are significantly weaker than the carbon doped oxide ILD material. Measurements on candidate materials indicate they are in some cases 10 to 100 times, e.g., at least about an order of magnitude, weaker than carbon doped oxide. These materials may be too weak to be accommodated in dies which are to be packaged using the current package-to-die interconnect architecture. An improved, low resistance package-to-die interconnect scheme for reducing die stresses would make it possible to use these significantly weaker ILD materials in the packaged die.

BRIEF DESCRIPTION OF THE DRAWINGS

FIG. 8 is a schematic illustration of an interconnect scheme/electronic assembly/semiconductor package of an example embodiment of the present invention.

FIG. 9 is an enlarged view of a portion of the interconnect scheme of FIG. 8 shown within the box C.

FIG. 10 is a schematic illustration of the die and substrate for making the interconnect scheme of FIGS. 8 and 9, shown before contacting the solder bump on the die with the copper contact member/bump on the substrate for soldering.

DETAILED DESCRIPTION

Figure 1:
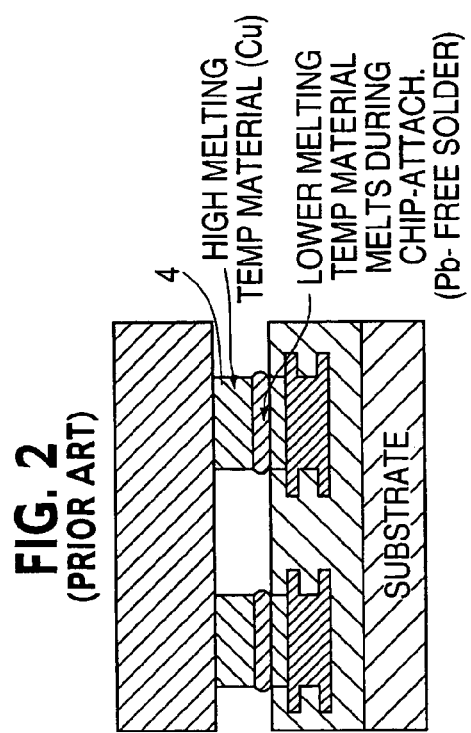
FIG. 1 is a schematic illustration of a current interconnect scheme.

An example embodiment of a package 7 with a package-die interconnect scheme according to the present invention is depicted in FIGS. 8–10. The package utilizes copper bumps 8 on a substrate 9 and solder bumps 10 on a die 11. In the example embodiment, the lower yield strength solder material, a AgSn solder in the example, acts as the die bump. The solder is electroplated on the die to form the die bumps 10. The copper bumps 8 on the substrate may be copper columns or studs, as needed. They are electroplated on the substrate lands or pads to provide standoffs, and to lower the resistance of the interconnect. If copper columns are not needed for performance, a solder with a melting temperature higher than the melting temperature of the solder on the die could be electroplated on the substrate for stand-off.

Figure 2:
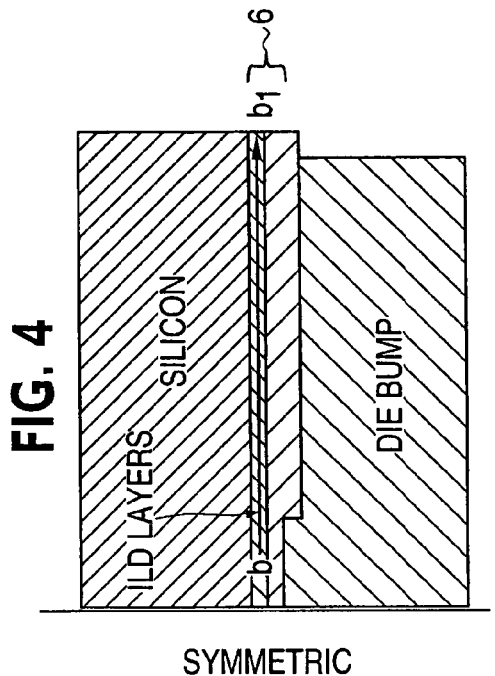
FIG. 2 is an enlarged view of a portion of the prior art interconnect scheme within the box A of FIG. 1.
Figure 3:
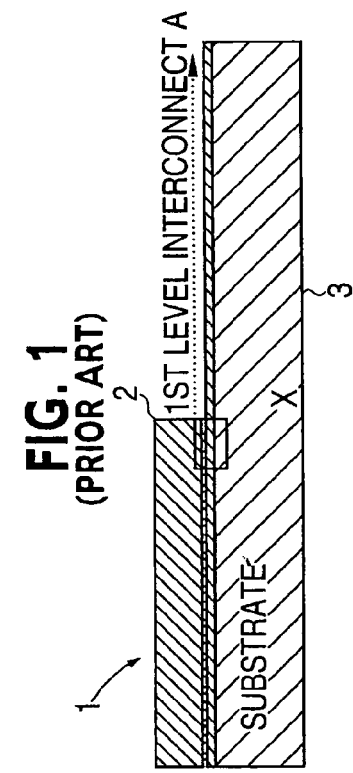
FIG. 3 is a schematic view of the die with copper bumps of the conventional interconnect scheme of FIGS. 1 and 2.

The present invention addresses the problem of ILD delamination under the die bumps during temperature cycling of the package by lowering the yield strength of the die bump material in relation to the copper or other conductive material of the contact member/stand-off on the substrate. This change has been found to help ILD integrity. Lowering the yield strength of the die bump material reduces the stresses transferred to the die (simplistically, the bump deforms in-elastically absorbing energy). More specifically, crystal structure correlations, and measurements indicate that the yield strength of the electroplated copper used for the die bumps in the conventional interconnect scheme of FIGS. 1–3, is in the 350–450 MPa range, making the bump extremely stiff. During temperature excursions (before and after die-attach), this stiff bump induces a significant amount of normal stresses on the dielectric layers in the die. These stresses cause gross delamination of the ILD interfaces during reliability testing. Modeling indicates that the biggest single contributor effecting ILD stresses on the die is the yield strength of the die bump. In many packages, performance requirements necessitate the use of electrically conductive standoffs/copper bumps in the interconnect stack-up. The present invention provides a method to incorporate the copper bumps in the interconnect stackup, while significantly reducing the stresses in the ILD material.

Lowering the yield strength of the die bump material in accordance with the present invention has been shown by modeling to reduce the stresses transferred to the die. This benefit of the invention is also borne out by reliability test results comparing ILD cracking with Cu die bumps and high lead solder die bumps according to the invention. Putting the material that melts during chip-join on the die, enables the use of a modified "instant-chip-join" like die-attach process according to the invention to significantly reduce coefficient of thermal expansion mismatch induced stresses (and die warpage) from soldering. In this process, the die with solder die bumps is heated to a temperature above the melting temperature of the solder of the die bumps, apart from the substrate. The substrate is preferably heated only to a substantially lower temperature and the two components are then joined for soldering the die to the substrate. The differential heating of the die and substrate exploits the principle that if elongation of the adherents, the die and substrate, at the temperature the solder solidifies, are the same, then, the coefficient of thermal expansion (CTE) mismatch induced stresses between the die and substrate from soldering can be minimized.

Figure 4:
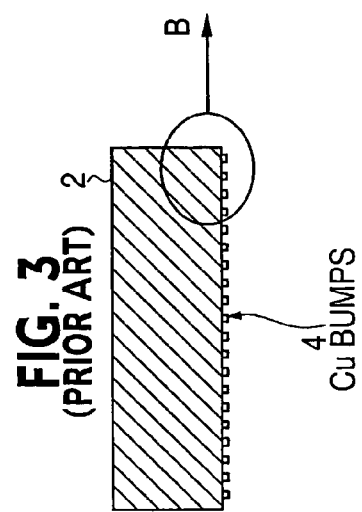
FIG. 4 is an enlarged view of a portion of the die with copper bumps within the circle B in FIG. 3, marked with the line b–b1 for stress plots, and showing thin film ILD layers in the lower, front surface of the die under a copper bump.
Figure 5:
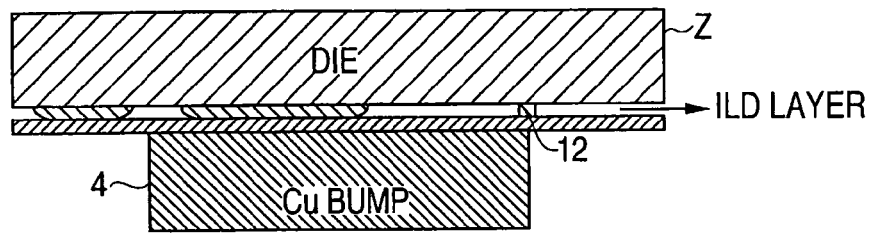
FIG. 5 is a schematic drawing of the die with ILD layer and copper bump wherein stresses in the ILD layer when the die is subjected to a thermal transient are shown in a stress contour plot along the ILD layer wherein the more darkly shaded region represents the region of highest stresses.

The modeling or simulation results comparing the interconnect scheme of the present invention with the conventional interconnect scheme of FIGS. 1–3 are illustrated in the drawings. That is, FIGS. 3 and 4 show details of a copper bump on the die of the conventional interconnect scheme of FIGS. 1 and 2, and the thin film ILD region under the bump. During heating and cooling the bare die, the CTE mismatch between the materials in the die cause stresses and strains in the thin film ILD layers in the die as shown in FIG. 5. In FIG. 5, the ILD layer represents a stress contour plot showing that the region 12 of highest stresses is at the edge of the copper bump, when the die is subjected to a thermal transient. The area under consideration is represented by the line B–B1 on the ILD layer in FIG. 4.

Figure 6:
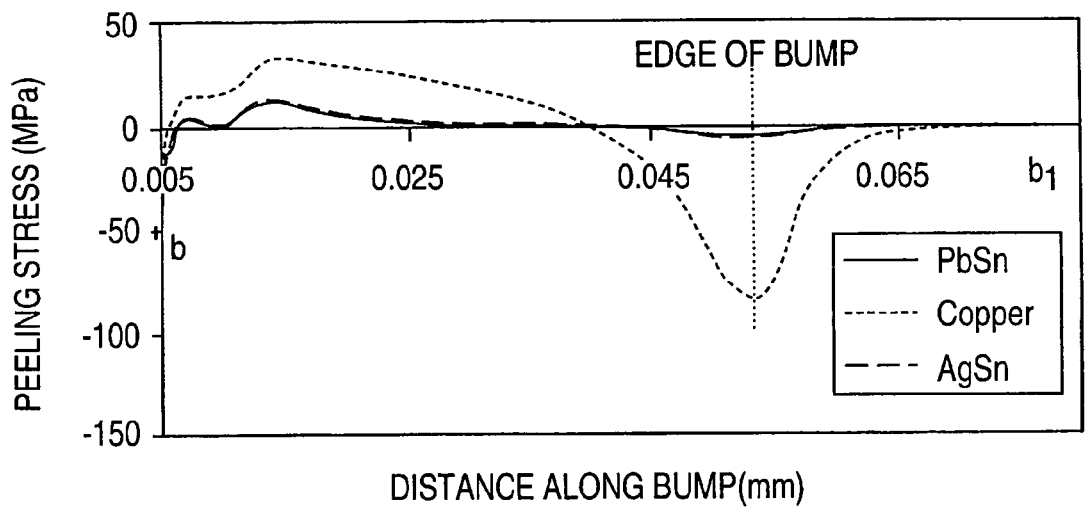
FIG. 6 shows plots of peeling stress in the ILD layer as a function of distance along the die bump for a copper bump of the prior art interconnect scheme and for two solder die bumps according to the present invention, when heated to the same temperature.

FIG. 6 compares the modeled stresses in the ILD layer along the line B–B1 (marked in FIG. 4), for different die bump materials, when they are subjected to the same $\Delta T$. Since the bump materials are electroplated at room temperature, room temperature is the stress-free state for the die. Heating (and cooling) induces CTE mismatch stresses on the die thin film layers due to the bump, as shown in FIG. 6. The peeling stress at the edge of the bump is markedly lower with the lead tin and silver tin solder materials used in accordance with the present invention, as compared with the copper die bump of the conventional interconnect scheme.

Since ILD delamination is the key failure mode, only the normal component of stress (peeling stress) is being compared in FIG. 6. It should be noted that even though the compressive peeling stress at the die edge (produced during heating the bare die) is in itself not a big concern, cooling the die reverses the direction of the stresses. Also, interaction of the package induced stresses with this copper bump induced stresses during different thermal loading conditions creates a significant increase in ILD stresses with the copper bump.

Figure 7:
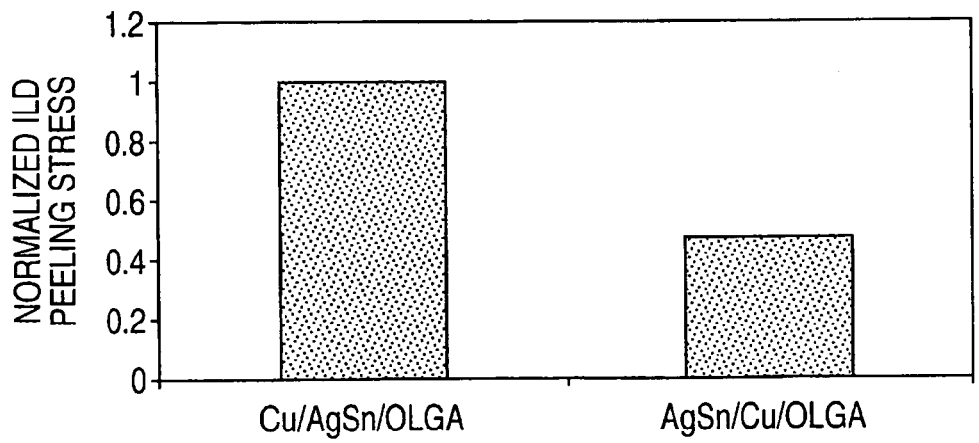
FIG. 7 is a comparison of normalized ILD peeling stress for the interconnect scheme of the present invention wherein a copper bump is provided on the substrate and the prior art interconnect scheme of FIGS. 1–3 where the copper bump is on the die.

FIG. 7 compares the maximum ILD peeling stress for two different die-bump/substrate bump/substrate combinations. For a case where the copper bump is on the substrate as in the present invention (the right side column in FIG. 7), as compared with the conventional interconnect scheme where the copper bump is on the die (the left side column in FIG. 7), it is noted that the maximum peeling stress after die-attach in the case of having the copper bump on the substrate is about half that of the current case where the copper bump is on the die. This difference is due to the large yield strength of electroplated copper (400 MPa) as opposed to the much lower yield strength for the AgSn solder (around 40 MPa at room temperature). The lower yield strength of the solder die bump of the present invention will relieve some of the stress (by undergoing local plastic deformation), without transferring it to the die ILD layers. The difference will be even more in the case of temperature cycling, where the cooling cycle will make the residual stress at the bump edge (shown in FIG. 6) positive, increasing the stress for the case where the copper bump is on the die. To put the 50% reduction in ILD stresses with the AgSn/Cu/organic material substrate (OLGA) combination of the invention (in the right side of FIG. 7) in perspective, the reduction in ILD stresses by going to a ceramic substrate (Cu/AgSn/ceramic) with 6.5 ppm/° C. CTE is only about 20%. Note, that even though the substrate in the conventional package of FIGS. 1–3 and the substrate in the package of the present invention illustrated in FIGS. 8–10 is a low cost organic substrate, this method can be applied to other common substrate materials like ceramic. However, the plastic and organic substrate materials have relatively high CTEs, along the order of 17 ppm/° C. The relatively larger CTE mismatch in packages using the higher CTE package substrate materials, where the silicon semiconductor chip typically has a CTE of about 2.6–3.3 ppm/° C., can induce higher ILD stresses.

This concludes the description of the example embodiment. Although the present invention has been described with reference to one illustrative embodiment thereof, it should be understood that numerous other modifications and embodiments can be devised by those skilled in the art that will fall within the spirit and scope of the principles of this invention. For example, convention die attach reflow process was used to demonstrate the ILD stress reduction using this invention in the example embodiment. Even more stress reduction can be obtained by combining this invention with a modified die attach process which makes the thermal expansion of the chip and the substrate before soldering the same or substantially the same due to separate heating of each to a different temperature in relation to their CTEs. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A method of interconnecting a die and a substrate to one another, the method comprising:
    heating a die having a relatively low melting temperature solder bump to a first temperature to form a reflowed solder bump;
    heating a substrate having a relatively higher melting temperature contact member to a second temperature that is lower than the first temperature; and
    joining the reflowed solder bump at the first temperature with the contact member at the second temperature to form a soldered joint.

2. The method according to claim 1, wherein the contact member is formed as a standoff extending above a surface of the substrate.

3. The method according to claim 2, wherein the solder bump is wetted on a top surface of the standoff to form the soldered joint.

4. The method according to claim 1, wherein the solder bump is provided over an inter-layer dielectric material of the die.

5. The method according to claim 4, wherein the inter-layer dielectric material has cohesive and adhesive strengths at least about an order of magnitude less than those of carbon-doped oxide inter-layer dielectric material.

6. The method according to claim 1, wherein a coefficient of thermal expansion of the substrate is at least 15 ppm/° C. and a coefficient of thermal expansion of the die is at least 2.7 ppm/° C. less than that of the substrate.

7. The method according to claim 6 further comprising minimizing stresses induced by a mismatch of the coefficients of thermal expansion.

8. The method according to claim 1, wherein the first temperature is above a melting temperature of the solder.

9. The method according to claim 1 wherein a coefficient of thermal expansion of the substrate is more than two times greater than a coefficient of thermal expansion of the die.

10. The method according to claim 1 wherein the contact member has a yield strength in a range of about 350 MPa to about 450 MlPa, and a yield strength of the solder bump is lower than that of the contact member.

11. A method of interconnecting a die and a substrate to one another, the method comprising:
   reflowing a plurality of solder bumps of a die by heating the plurality of solder bumps and the die to a first temperature above a solder melting temperature, wherein each of the plurality of solder bumps have a relatively low melting temperature and a relatively low yield strength;
   heating a plurality of electrically conductive contact members of a substrate and the substrate to a second temperature that is lower than the first temperature, wherein each of the contact members have a relatively higher melting temperature and have a yield strength in a range of about 350 MPa to about 450 MPa; and
   joining the plurality of reflowed solder bumps at the first temperature with corresponding ones of the plurality of contact members at the second temperature to form a soldered substrate-die connection.

12. The method according to claim 11 wherein the plurality of solder bumps includes at least one or lead, tin, and silver.

13. The method according to claim 11 wherein each of the plurality of contact members includes a bump in a form of a column or stud.

14. The method according to claim 11 wherein each of the plurality of contact members includes copper.

15. The method according to claim 11 wherein the plurality of contact members are non-melting at a solder liquidous temperature.

16. The method according to claim 11 wherein at least one of the plurality of solder bumps includes a stress-relieving element to absorb stress in the connection.

17. The method according to claim 11 wherein at least one of the plurality of solder bumps is plastically deformed.

* * * * *

UNITED STATES PATENT AND TRADEMARK OFFICE
CERTIFICATE OF CORRECTION

| | |
|---|---|
| PATENT NO. | : 7,122,403 B2 |
| APPLICATION NO. | : 11/010123 |
| DATED | : October 17, 2006 |
| INVENTOR(S) | : Chandran et al. |

It is certified that error appears in the above-identified patent and that said Letters Patent is hereby corrected as shown below:

Column 5, line 22, in Claim 10, delete "MIPa," and insert -- MPa, --, therefor.

Signed and Sealed this

Twenty-seventh Day of February, 2007

JON W. DUDAS
*Director of the United States Patent and Trademark Office*